United States Patent
Wei et al.

(10) Patent No.: US 9,721,804 B1
(45) Date of Patent: Aug. 1, 2017

(54) SEMICONDUCTOR DEVICE AND METHOD FOR FABRICATING THE SAME

(71) Applicant: UNITED MICROELECTRONICS CORP., Hsin-Chu (TW)

(72) Inventors: Huang-Ren Wei, Tainan (TW); Hsuan-Sheng Lin, Chiayi (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/043,627

(22) Filed: Feb. 15, 2016

(30) Foreign Application Priority Data

Jan. 20, 2016 (TW) .............................. 105101619 A

(51) Int. Cl.
*H01L 29/06* (2006.01)
*H01L 21/308* (2006.01)
*H01L 21/306* (2006.01)

(52) U.S. Cl.
CPC ...... *H01L 21/3081* (2013.01); *H01L 21/3085* (2013.01); *H01L 21/30604* (2013.01); *H01L 29/0657* (2013.01)

(58) Field of Classification Search
CPC ......... H01L 29/0657; H01L 21/823431; H01L 21/845; H01L 27/0886; H01L 27/10826; H01L 27/10879
USPC ................................................. 257/622, 722
See application file for complete search history.

(56) References Cited

U.S. PATENT DOCUMENTS

| 8,822,088 B2* | 9/2014 | Tajima ................... B82Y 30/00 429/218.1 |
| 9,111,874 B2 | 8/2015 | Wang et al. |
| 2002/0190342 A1* | 12/2002 | Hur ................... H01L 21/76229 257/499 |
| 2008/0283930 A1* | 11/2008 | Dyer ................. H01L 21/76229 257/371 |
| 2009/0108395 A1* | 4/2009 | Choi ................. H01L 21/76232 257/506 |
| 2013/0187237 A1 | 7/2013 | Yu et al. |
| 2015/0251133 A1 | 9/2015 | Cox et al. |

OTHER PUBLICATIONS

Huang, Title of Invention: Patterned Structure of a Semiconductor Device and a Manufacturing Method Thereof, U.S. Appl. No. 14/710,602, filed May 13, 2015.

* cited by examiner

*Primary Examiner* — Tan N Tran
(74) *Attorney, Agent, or Firm* — Winston Hsu

(57) ABSTRACT

A method for fabricating semiconductor device is disclosed. The method includes the steps of: providing a substrate; forming a fin-shaped structure on the substrate; performing a first etching process to remove part of the fin-shaped structure for forming a trench; and performing a second etching process to extend the depth of the trench and divide the fin-shaped structure into a first portion and a second portion.

8 Claims, 5 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of using two etching process to divide fin-shaped structure into two parts.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication, fin-shaped structure may be divided and insulating material is deposited to form shallow trench isolation (STI). However, the STI formed between fin-shaped structures often results in expansion and affects the formation of gate structure thereafter. Hence, how to improve the current FinFET fabrication and structure for resolving this issue has become an important task in this field.

SUMMARY OF THE INVENTION

According to a preferred embodiment of the present invention, a method for fabricating semiconductor device is disclosed. The method includes the steps of: providing a substrate; forming a fin-shaped structure on the substrate; performing a first etching process to remove part of the fin-shaped structure for forming a trench; and performing a second etching process to extend the depth of the trench and divide the fin-shaped structure into a first portion and a second portion.

According to another aspect of the present invention, a semiconductor device is disclosed. The semiconductor device includes: a substrate; a first fin-shaped structure on the substrate; a second fin-shaped structure and a third fin-shaped structure adjacent to two sides of the first fin-shaped structure; a first trench between the first fin-shaped structure and the second fin-shaped structure; and a second trench between the first fin-shaped structure and the third fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
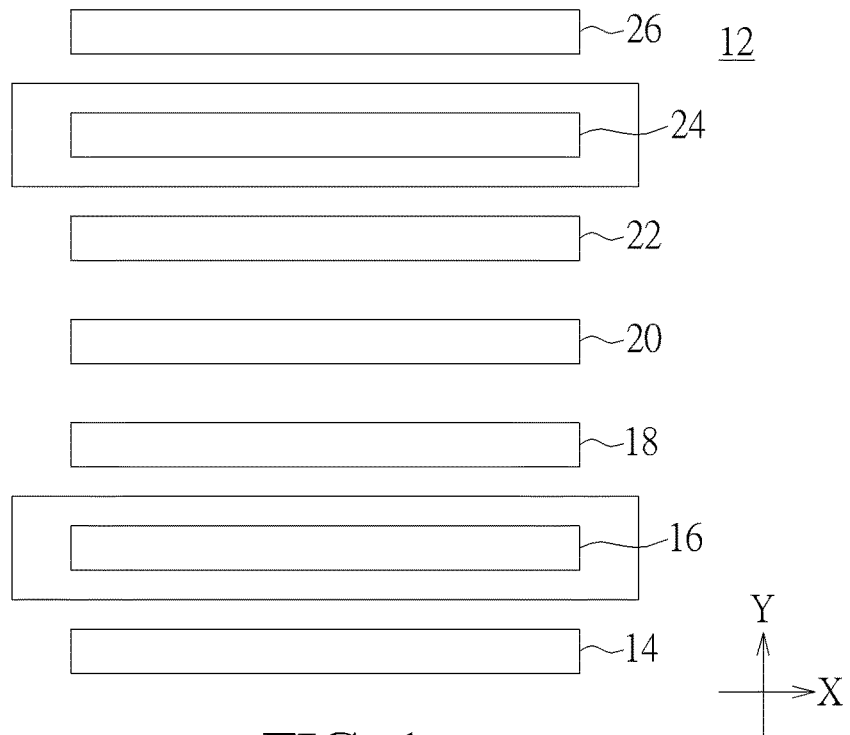
FIGS. 1-2 are top views illustrating a method for fabricating semiconductor device according to a preferred embodiment of the present invention.

Referring to FIGS. 1-8, FIGS. 1-2 are top views illustrating a method for fabricating a semiconductor device according to a preferred embodiment of the present invention, and FIGS. 3-8 are cross-sectional views illustrating a method for fabricating the semiconductor device. As shown in FIG. 1, a substrate 12, such as a silicon substrate or silicon-on-insulator (SOI) substrate is provided, and a plurality of fin-shaped structures 14, 16, 18, 20, 22, 24, 26 are formed on the substrate 12.

The formation of the fin-shaped structures 14, 16, 18, 20, 22, 24, 26 could be accomplished by first forming a patterned mask (now shown) on the substrate, 12, and an etching process is performed to transfer the pattern of the patterned mask to the substrate 12. Alternatively, the formation of the fin-shaped structure 14, 16, 18, 20, 22, 24, 26 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structures 14, 16, 18, 20, 22, 24, 26. Moreover, if the substrate 12 were a SOI substrate, a patterned mask could be used to etch a semiconductor layer on the bottom oxide layer without etching through the semiconductor layer for forming the fin-shaped structure 14, 16, 18, 20, 22, 24, 26.

Next, a first fin-cut process is conducted by using a photo-etching process to remove the fin-shaped structures 16 and 24 surrounded by the rectangular block along X-direction in FIG. 1. The fin-shaped structures 18, 20, 22 and fin-shaped structures 14 and 26 are remained after the first fin-cut process. It should be noted that despite two of the fin-shaped structures, such as fin-shaped structures 16 and 24 are removed in this embodiment, the quantity and location of the fin-shaped structures being removed could all be adjusted according to the demand of the product.

Figure 2:
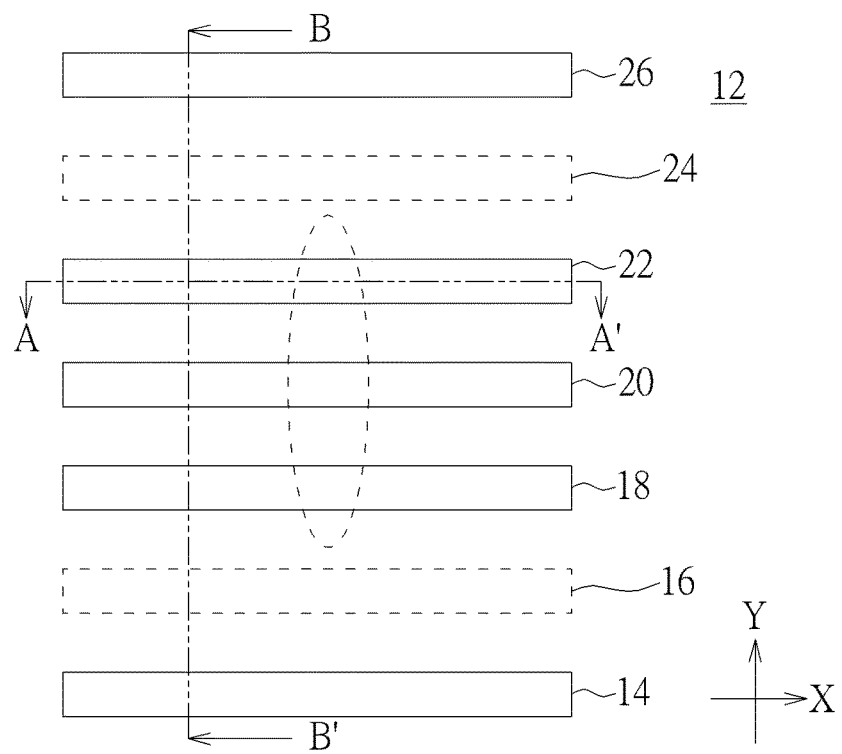

Next, as shown in FIG. 2, a second fin-cut process is conducted by using etching process to remove part of the fin-shaped structures 18, 20, 22 marked by the elliptical dotted lines along Y-direction in FIG. 2. This divides the fin-shaped structures 18, 20, 22 into two portions. It should be noted that in contrast to the aforementioned first fin-cut process of using a single etching process to remove the fin-shaped structures 16, 24 completely, two etching processes are preferably conducted in the second fin-cut process to form a trench in the fin-shaped structures 18, 20, 22 and divide the fin-shaped structures 18, 20, 22 into two portions.

Figure 3:
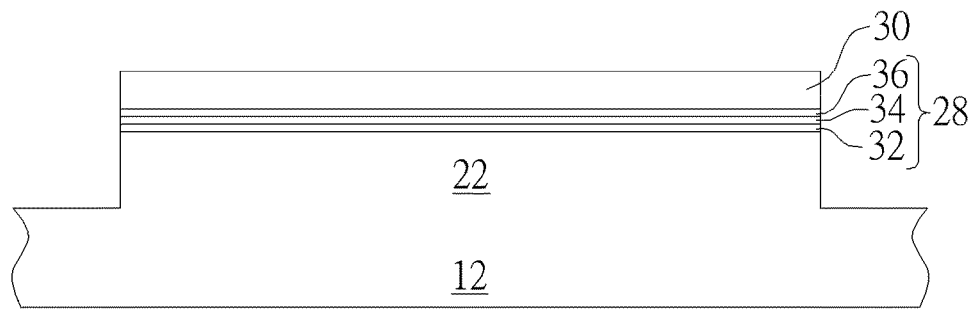
FIGS. 3-8 are cross-sectional views illustrating a method for fabricating semiconductor device according to a preferred embodiment of the present invention.

Referring to FIGS. 3-8, FIGS. 3-8 are detailed views illustrating the process of dividing the fin-shaped structure 22 into two portions along the sectional line AA' of FIG. 2. It should be noted that a hard mask 28 and a dielectric layer 30 are preferably formed on each of the fin-shaped structures 14, 16, 18, 20, 22, 24, 26 before the first fin-cut process is conducted. For instance, as shown in FIG. 3, the hard mask 28 is preferably an oxide-nitride-oxide (ONO) stack including a silicon oxide layer 32, a silicon nitride layer 34, and another silicon oxide layer 36, and the dielectric layer 30 could be composed of organic dielectric layer (ODL) or photoresist material, but not limited thereto.

Figure 4:
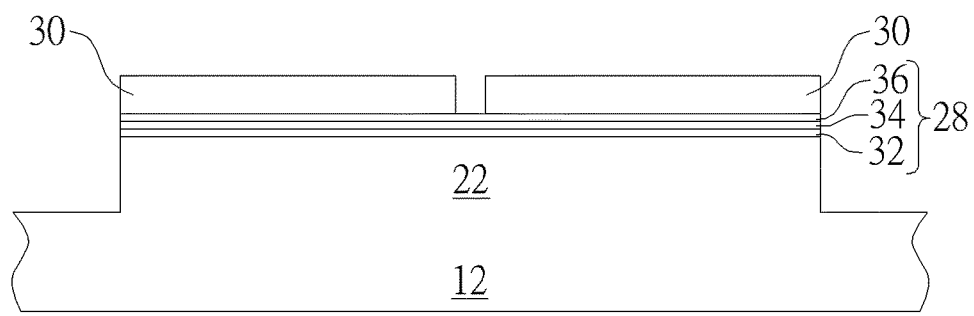

Next, as shown in FIG. 4, a photo-etching process is conducted on the dielectric layer 30 by first forming a patterned resist (not shown) on the dielectric layer 30, and then using etching to remove part of the dielectric layer 30 for forming an opening to expose the surface of the silicon oxide layer 36 underneath.

Figure 5:
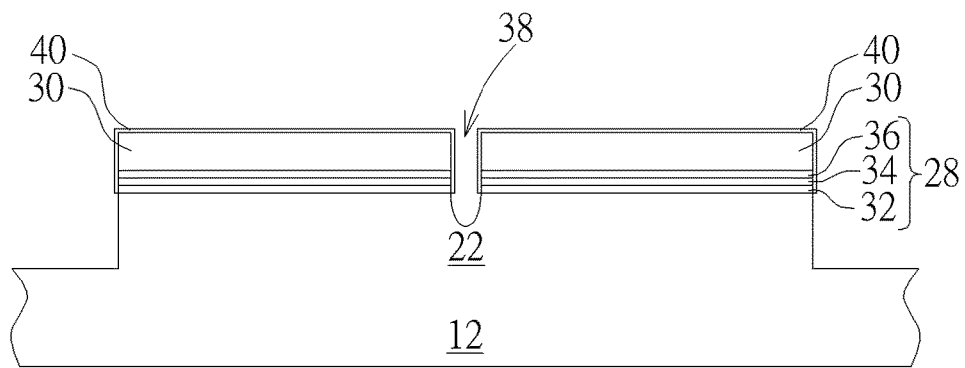

Next, as shown in FIG. 5, after stripping the photoresist, a first etching process is conducted by using the patterned dielectric layer 30 as mask to remove part of the hard mask 28 and part of the fin-shaped structure 22 for forming a trench 38 while forming a passivation layer 40 on the dielectric layer 30 and hard mask 28. Preferably, a first etchant used to form the trench 38 and passivation layer 40 in the first etching process is selected from the group consisting of $Cl_2$, $O_2$, and $SiCl_4$.

Specifically, the first etching process and the formation of the passivation layer 40 are accomplished in-situly, or viewing from another perspective, as part of the dielectric layer 30, part of the hard mask 28, and part of the fin-shaped structure 22 are removed by the first etchant to form the trench 38, a passivation layer 40 is slow built-up or accumulated on the top surface of the dielectric layer 30 and sidewalls of the hard mask 28.

Preferably, the silicon atom from the $SiCl_4$ component of first etchant is specifically utilized to react with oxides from the dielectric layer 30 and hard mask 28 to form polymers preferably composed of $SiO_2$, and these polymers essentially become the passivation layer 40 used for protecting the dielectric layer 30 and hard mask 28 in this embodiment.

Figure 6:
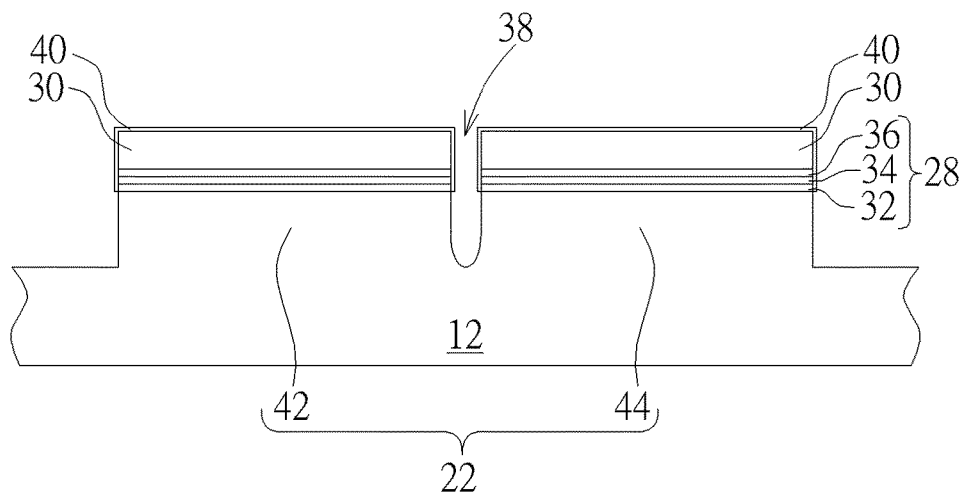

Next, as shown in FIG. 6, a second etching process is conducted by using a second etchant to extend the depth of the trench 38 further downward and divide the fin-shaped structure 22 into a first portion 42 and a second portion 44. Preferably, the second etchant is selected from the group consisting of $Cl_2$ and $O_2$. More specifically, the second etching process of this embodiment preferably uses the passivation layer 40 as mask to further etch the fin-shaped structure 22 that has already been partially removed during the first etching process. This extends the depth of the trench 38 further downward till reaching the substrate 12 and divides the fin-shaped structures 22 into two parts, including a first portion 42 and a second portion 44.

Typically, etchant used in fin-shaped structure removal is selected from the group consisting of $Cl_2$ and $O_2$. This recipe however not only consumes a great portion of dielectric layer and hard mask atop the fin-shaped structure while the fin-shaped structure is divided in half, but also unable to maintain the width of the trench. This causes the trench width within top portion of the fin-shaped structure to be significantly larger than trench width in the hard mask, thereby affecting the deposition of insulating material afterwards and the critical dimension of the device.

In other to resolve this issue, the passivation layer 40 formed during the aforementioned first etching process is preferably used to protect the top surface and sidewalls of the dielectric layer 30 as well as the sidewalls of the hard mask 28 so that these two elements are affected by the second etchant used during the second etching process.

Figure 7:
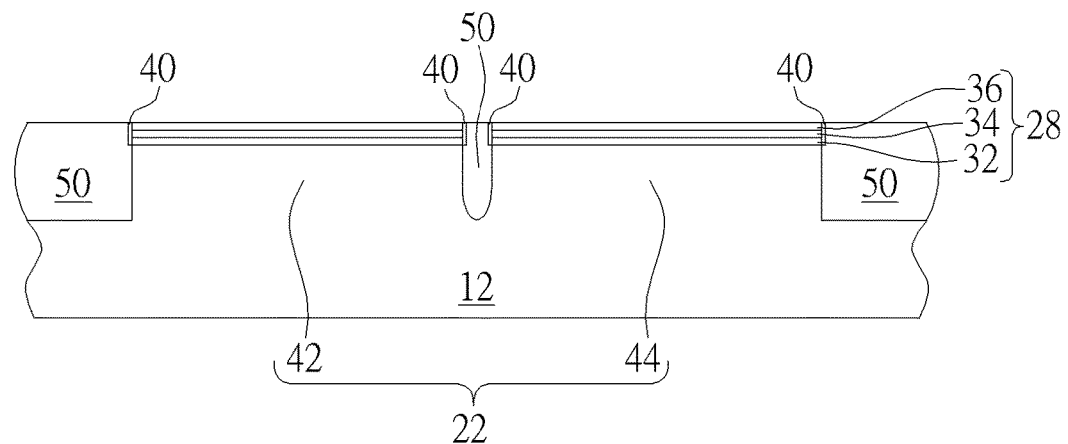

Next, as shown in FIG. 7, a shallow trench isolation (STI) formation could be conducted by first depositing an insulating material 50 composed of silicon oxide into the trench 38 and fill the space surrounding the fin-shaped structure 22, and then using a planarizing process, such as chemical mechanical polishing (CMP) process to remove part of the insulating material 40, part of the passivation layer 40, and the dielectric layer 30 and stop of the hard mask 28 surface.

It should be noted that at this stage, part of the passivation layer 40 is still remained on the sidewalls of the hard mask 28.

Figure 8:
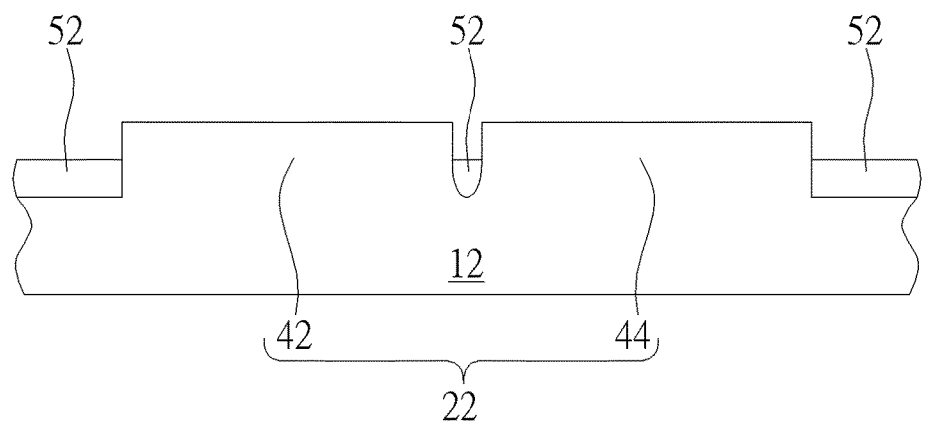

Next, as shown in FIG. 8, an etching back process is conducted to remove part of the insulating material 50 once more and the remaining passivation layer 40 so that the top surface of the remaining insulating material 50 is lower than the top surface of the hard mask 28. This forms a STI 52 in the trench 38 and around the divided first portion 42 and second portion 44. Next, another etching process is conducted to fully remove the hard mask 28. This completes the fabrication of a semiconductor device according to a preferred embodiment of the present invention.

Figure 9:
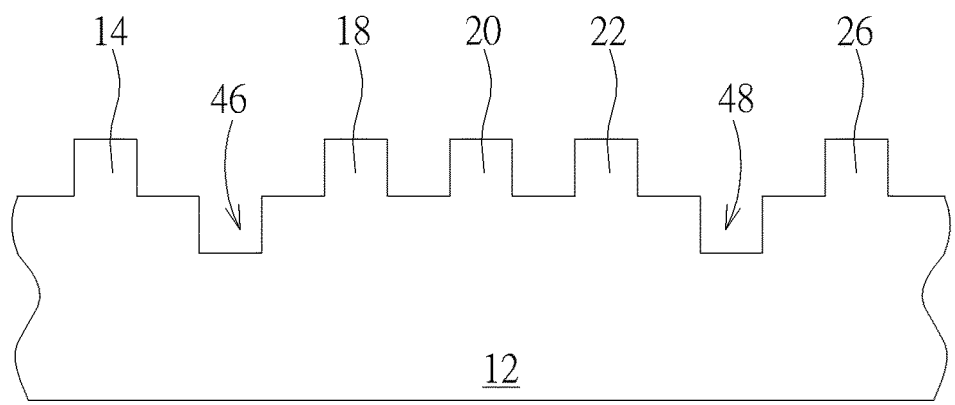
FIG. 9 illustrates a structural view of a semiconductor device according to an embodiment of the present invention.

Referring to FIG. 9, FIG. 9 illustrates a structural view of FIG. 2 along the sectional line BB' after the aforementioned second etching process is completed. As shown in FIG. 9, the semiconductor device includes a substrate 12, fin-shaped structures 14, 18, 20, 22, 26 on the substrate 12, a trench 46 between the fin-shaped structures 14 and 18, and a trench 48 between the fin-shaped structures 22 and 26. Despite three fin-shaped structures 18, 20, 22 are disposed between the trenches 46 and 48 and only one fin-shaped structure 14 and one fin-shaped structure 26 are disposed on other sides of the trenches 46 and 48, the quantity of the fin-shaped structures 14, 18, 20, 22, 26 is not limited to the ones disclosed in this embodiment, but could all be adjusted according to the demand of the product. Also, for simplicity purpose, the hard mask on top of each of the fin-shaped structures 14, 18, 20, 22, 26 is not shown in the figure.

In this embodiment, since the location of the fin-shaped structures 16 and 24 shown in FIG. 1 has been etched twice by the aforementioned first fin-cut process and the second fin-cut process, the original location of the fin-shaped structures 16, 24 after the second fin-cut process would form trenches 46 and 48 instead of a surface even with the substrate 12 surface or the bottom surface of fin-shaped structures 14, 18, 20, 22, 26.

Overall, the fin-shaped structures 18, 20, 22 between the two trenches 46 and 48 preferably share same height, the heights of the fin-shaped structures 18, 20, 22 are equivalent to the heights of the fin-shaped structures 14, 26, and the height of the fin-shaped structure 14 is also equivalent to the height of the fin-shaped structure 26. However, according to another embodiment of the present invention, the height of the fin-shaped structures 18, 20, 22 could also be different from the fin-shaped structures 14, 26 while the fin-shaped structures 14, 26 share same height, which is also within the scope of the present invention.

In addition, the bottom surface of the fin-shaped structures 18, 20, 22 is even with the bottom surface of the fin-shaped structures 14, 26 as the bottom surfaces of the fin-shaped structures 14, 18, 20, 22, 26 are all even with the top surface of the substrate 12, the bottom surface of each of the trenches 46, 48 is lower than the bottom surface of the fin-shaped structures 14, 18, 20, 22, 26, and the bottom surface of the trench 46 is even with the bottom surface of the trench 48.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate;

a plurality of first fin-shaped structures on the substrate, wherein the substrate extending between and contacting sidewalls of the first fin-shaped structures comprises a completely planar surface;

a second fin-shaped structure and a third fin-shaped structure adjacent to two sides of the first fin-shaped structures;

a first trench between the first fin-shaped structures and the second fin-shaped structure, wherein a bottom surface of the first trench is lower than the completely planar surface between the first fin-shaped structures; and a second trench between the first fin-shaped structures and the third fin-shaped structure, wherein the bottom surfaces of the first trench and the second trench are lower than the completely planar surface between the first fin-shaped structures, wherein the width of each of the first fin-shaped structures is equal to a width of the first trench, wherein the depths of the first trench and the second trench are equal.

2. The semiconductor device of claim 1, wherein the height of the first fin-shaped structures and the height of the second fin-shaped structure are the same.

3. The semiconductor device of claim 2, wherein the height of the second fin-shaped structure and the height of the third fin-shaped structure are the same.

4. The semiconductor device of claim 1, wherein the height of the first fin-shaped structures and the height of the second fin-shaped structure are different.

5. The semiconductor device of claim 4, wherein the height of the second fin-shaped structure and the height of the third fin-shaped structure are the same.

6. The semiconductor device of claim 1, wherein the bottom surfaces of the first fin-shaped structures and the second fin-shaped structure are coplanar.

7. The semiconductor device of claim 1, wherein the bottom surface of the first trench is lower than the bottom surface of the first fin-shaped structures.

8. The semiconductor device of claim 1, wherein the bottom surfaces of the first trench and the second trench are coplanar.

* * * * *